(12) United States Patent
Jung et al.

(10) Patent No.: US 9,450,159 B2
(45) Date of Patent: Sep. 20, 2016

(54) LIGHT-EMITTING DIODE PACKAGE AND METHOD FOR MANUFACTURING SAME

(71) Applicant: Seoul Viosys Co., Ltd., Ansan-si (KR)

(72) Inventors: Hee Cheul Jung, Ansan-si (KR); Jung Hye Chae, Ansan-si (KR); Bo Ram I Jang, Ansan-si (KR); Jun Yong Park, Ansan-si (KR); Dae Woong Suh, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 45 days.

(21) Appl. No.: 14/355,521

(22) PCT Filed: Oct. 9, 2012

(86) PCT No.: PCT/KR2012/008153
§ 371 (c)(1),
(2) Date: Apr. 30, 2014

(87) PCT Pub. No.: WO2013/065958
PCT Pub. Date: May 10, 2013

(65) Prior Publication Data
US 2014/0284650 A1    Sep. 25, 2014

(30) Foreign Application Priority Data

Oct. 31, 2011 (KR) .................. 10-2011-0112025

(51) Int. Cl.
*H01L 21/44* (2006.01)
*H01L 33/58* (2010.01)
*H01L 33/48* (2010.01)

(52) U.S. Cl.
CPC ............. *H01L 33/58* (2013.01); *H01L 33/486* (2013.01); *H01L 2924/0002* (2013.01); *H01L 2933/0033* (2013.01); *H01L 2933/0058* (2013.01)

(58) Field of Classification Search
CPC ....... H01L 33/60; H01L 33/20; H01L 33/62; H01L 33/54; H01L 33/58
USPC .......................... 257/98–100, 81, 79, 88, 84
See application file for complete search history.

(56) References Cited

U.S. PATENT DOCUMENTS

2002/0056850 A1  5/2002  Murata
2004/0201987 A1  10/2004 Omata
(Continued)

FOREIGN PATENT DOCUMENTS

EP     1467417     10/2004
EP     2098905     9/2009
(Continued)

OTHER PUBLICATIONS

Extended European Search Report issued on May 7, 2015, in European Patent Application No. 12844955.0.

(Continued)

*Primary Examiner* — Hoa B Trinh
(74) *Attorney, Agent, or Firm* — H.C. Park & Associates, PLC

(57) ABSTRACT

Disclosed are a light-emitting diode package and a method for manufacturing same. The method for manufacturing a light-emitting diode package comprises: preparing a package main body having a cavity and an air vent passageway which extends from the cavity; installing a light-emitting diode inside the cavity of the package main body; attaching a transparent member by means of an adhesive so as to cover the upper part of the cavity; and blocking the air vent passageway by forming a sealing member. As the air vent passageway is blocked after the transparent member is attached, the transparent member may be prevented from peeling off from the air pressure inside the cavity.

11 Claims, 5 Drawing Sheets

(56) References Cited

U.S. PATENT DOCUMENTS

| | | |
|---|---|---|
| 2006/0027828 A1 | 2/2006 | Kikuchi |
| 2007/0152229 A1 | 7/2007 | Yoshida et al. |
| 2008/0054288 A1 | 3/2008 | Harrah et al. |
| 2009/0225550 A1 | 9/2009 | Yamaguchi |
| 2009/0294940 A1 | 12/2009 | Sugimoto et al. |
| 2011/0089449 A1 | 4/2011 | Chou et al. |
| 2013/0105850 A1* | 5/2013 | Komatsu ............... H01L 33/505 257/98 |

FOREIGN PATENT DOCUMENTS

| | | |
|---|---|---|
| EP | 2128905 | 12/2009 |
| JP | 2004-119881 | 4/2004 |
| JP | 2007-066939 | 3/2007 |
| JP | 2010-231901 | 10/2010 |
| KR | 10-2007-0121423 | 12/2007 |
| KR | 10-2008-0028099 | 3/2008 |
| KR | 10-2009-0028805 | 3/2009 |
| KR | 10-2011-0043468 | 4/2011 |
| KR | 10-2011-0111941 | 10/2011 |

OTHER PUBLICATIONS

International Search Report dated Feb. 14, 2013, issued in International Patent Application No. PCT/KR2012/008153.

* cited by examiner

LIGHT-EMITTING DIODE PACKAGE AND METHOD FOR MANUFACTURING SAME

CROSS-REFERENCE TO RELATED APPLICATIONS

This application is the National Stage of International Application PCT/KR2012/008153, filed on Oct. 9, 2012, and claims priority from and the benefit of Korean Patent Application No. 10-2011-0112025, filed on Oct. 31, 2011, which are hereby incorporated by reference for all purposes as if fully set forth herein.

BACKGROUND OF THE INVENTION

1. Field

The present invention relates to a light emitting diode package and, more particularly, to a UV light emitting diode package and a method of fabricating the same.

2. Discussion of the Background

Gallium nitride-based light emitting diodes are widely used for display devices and backlight units. In addition, with low power consumption and long lifespan as compared with existing incandescent lamps or fluorescent lamps, applications of light emitting diodes have expanded to general lighting by replacing existing incandescent lamps, fluorescent lamps, and the like. Recently, light emitting diodes emitting deep ultraviolet (DUV) light having a wavelength of 365 nm or less are developed and can be widely applied to air and water sterilization, surface contaminant removal, optical sensors such as a bio-agent detector, UV curing of polymers, instruments for medicine and analysis, and the like.

In general, DUV light emitting diodes (LEDs) has a multi-quantum well structure which includes gallium nitride-based well layers containing Al between an n-type AlGaN layer and a p-type AlGaN layer to emit light of short wavelengths. Since UV light emitted from such a DUV LED can be easily absorbed by a typical sealing resin such as silicone or epoxy resins, it is difficult to seal the DUV LED using the sealing resin unlike a blue LED.

Accordingly, a package is generally used to protect an LED by mounting the LED on a metal stem and bonding a window-integrated cap to the metal stem in the related art. However, since such a stem package is expensive due to high material and manufacturing costs, attempts have been made to use low cost packages such as ceramic packages or general plastic packages as UV LED packages.

For example, with an LED placed in a cavity of a package body, the cavity may be sealed by attaching a lens to a package body using a bonding agent. The cavity is sealed by the package body, the lens and the bonding agent, thereby preventing external moisture and the like from entering the cavity. However, during attachment of the lens, the lens can be separated from the package body by compressed air within the cavity, thereby causing bonding failure. For example, when the lens is compressed on the package body using a lens holder with the bonding agent disposed between the lens and the package body, compressed air is generated within the cavity. When the lens holder is removed, the lens can be separated from the package body by the compressed air. Moreover, upon curing of the bonding agent, air pressure within the cavity can be increased due to expansion of air within the cavity, thereby causing separation of the lens from the package body.

SUMMARY

One aspect of the present invention is to provide a light emitting diode package capable of preventing bonding failure of a lens.

Another aspect of the present invention is to provide a light emitting diode package, in which a lens is bonded to a package body using a bonding agent to seal a cavity, thereby preventing bonding failure of the lens while sealing the cavity.

A further aspect of the present invention is to provide a method of fabricating a light emitting diode package so as to prevent bonding failure of a lens.

Embodiments of the present invention provides a light emitting diode package, which includes: a package body having a cavity and an air discharge channel connected to the cavity; a light emitting diode placed within the cavity; a transparent member covering an upper side of the cavity and allowing light emitted from the light emitting diode to pass therethrough; a bonding agent bonding the transparent member to the package body; and a sealing material formed in the air discharge channel and blocking the air discharge channel, wherein a closed space is formed within the cavity.

Embodiments of the present invention provides a method of fabricating a light emitting diode package, which includes: preparing a package body including a cavity and an air discharge channel extending from the cavity, placing a light emitting diode within a cavity of the package body, bonding a transparent member to the package body to cover an upper side of the cavity using a bonding agent, and forming a sealing material to block the air discharge channel.

According to the embodiments of the present invention, an air discharge channel formed in a package body, thereby preventing a transparent member from being separated from the package body by air pressure within a cavity when bonding the transparent member to the package body.

BRIEF DESCRIPTION OF DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
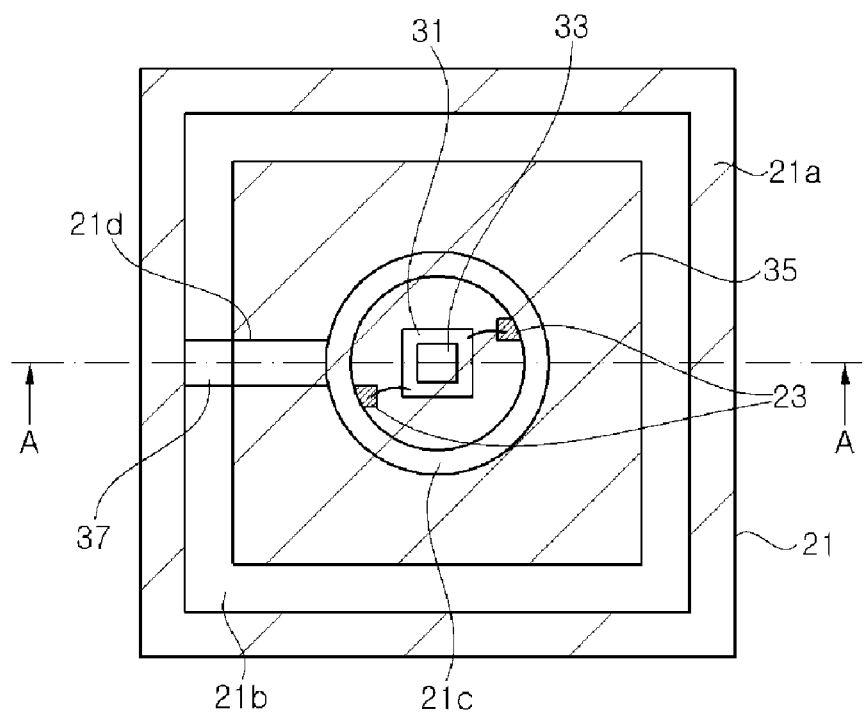
FIG. 1 is a plan view of a light emitting diode package according to one embodiment of the present invention.

Hereinafter, exemplary embodiments of the present invention will be described in detail with reference to the accompanying drawings. The following embodiments are given by way of illustration to provide a thorough understanding of the present invention to those skilled in the art. Thus, the present invention is not limited to the following embodiments and may be embodied in different ways. It should be understood that the drawings are not to precise scale and some of the dimensions, such as width, length, thickness, and the like, are exaggerated for clarity of description in the drawings. Like elements are denoted by like reference numerals throughout the specification and drawings.

Figure 2:
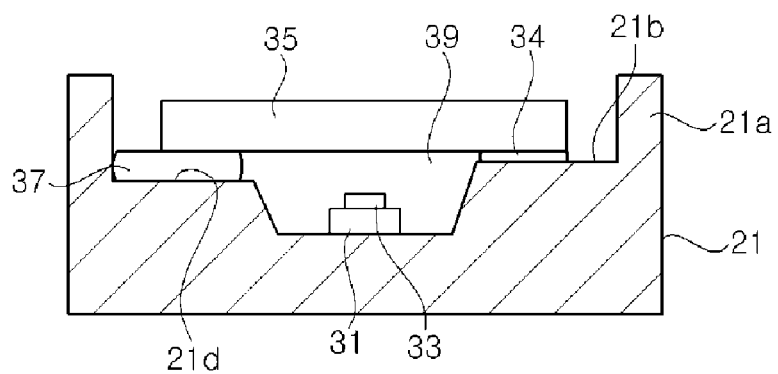
FIG. 2 is a cross-sectional view taken along line A-A of FIG. 1.

FIG. 1 is a plan view of a light emitting diode package according to one embodiment of the present invention and FIG. 2 is a cross-sectional view taken along line A-A of FIG. 1.

Referring to FIG. 1 and FIG. 2, a light emitting diode package according to one embodiment of the invention includes a package body (21), a sub-mount (31), a light emitting diode (33), a transparent member (35), a bonding agent (34), and a sealing material (37).

The package body (21) may include an outer wall (21a) constituting an outer circumference of the package body (21), an upper surface (21b) in a region surrounded by the outer wall (21a), and a cavity (21c) surrounded by the upper surface (21b). The package body (21) may be a ceramic body formed by a simultaneous burning process using a ceramic sheet, but is not limited thereto. Alternatively, the package body (21) may be a plastic body.

The package body (21) may be formed with an air discharge channel (21d), which is connected to the cavity (21c) and extends towards the outer wall (21a). The air discharge channel (21d) may be a groove formed on the upper surface surrounding the cavity (21c). The groove (21d) may extend to the outer wall (21a), but is not limited thereto.

In addition, lead terminals (23) may be provided to the package body (21). The lead terminals (23) extend outside the package body (21) to be connected to an external power source.

The light emitting diode (33) is placed within the cavity (21c). The light emitting diode (33) may be mounted on the sub-mount (31) by flip-chip bonding, and the sub-mount (31) may be bonded to the package body by a bonding agent and the like. The light emitting diode is a DUV LED, and may emit, for example, light having a wavelength of 250 nm to 365 nm. In addition, bonding wires may electrically connect the sub-mount (31) to the lead terminals (23) formed in the package body.

The transparent member (35) is bonded to the package body (21) by the bonding agent (34). The bonding agent (34) is placed on the upper surface (21b) surrounding the cavity (21c) to bond the transparent member (35) to the package body (21). As a result, a region of the upper surface (21b) surrounding the cavity (21c) excluding the air discharge channel (21d) is sealed by the bonding agent (34). On the other hand, the transparent member (35) may be formed of a transparent material, for example, quartz or sapphire, to allow light emitted from the light emitting diode to pass therethrough. The transparent member (35) may have a planar sheet shape, as shown.

The air discharge channel (21d) extends from the cavity (21c) to an outside of the transparent member (35). Namely, the transparent member (35) is disposed to straddle some regions of the air discharge channel (21d).

The sealing material (37) is formed in the air discharge channel (21d) and blocks the air discharge channel (21d). The sealing material (37) fills at least part of the air discharge channel (21d) to prevent external moisture or the like from entering the cavity (21c). The sealing material (37) may be formed of a curable resin, such as silicone, epoxy, and the like. The sealing material (37) fills a space created by the transparent member (35) and the air discharge channel (21d) to block the air discharge channel. As a result, a closed space is formed in the cavity (21c).

In this embodiment, the air discharge channel (21d) is the groove formed in the upper surface (21b) of the package body (21), but is not limited thereto. For example, the air discharge channel (21d) may be a passage formed inside the package body (21) under the upper surface (21b) such that an entrance of the passage is placed outside the transparent member (35) and is connected to the cavity (21c).

Figure 3:
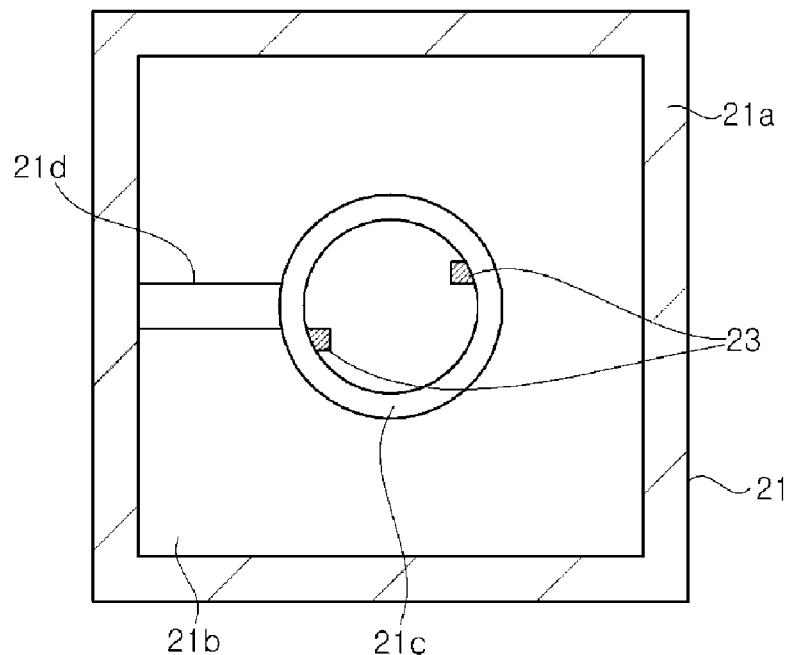
FIG. 3 to FIG. 5 are plan views illustrating a method of fabricating a light emitting diode package according to one embodiment of the present invention.
Figure 4:
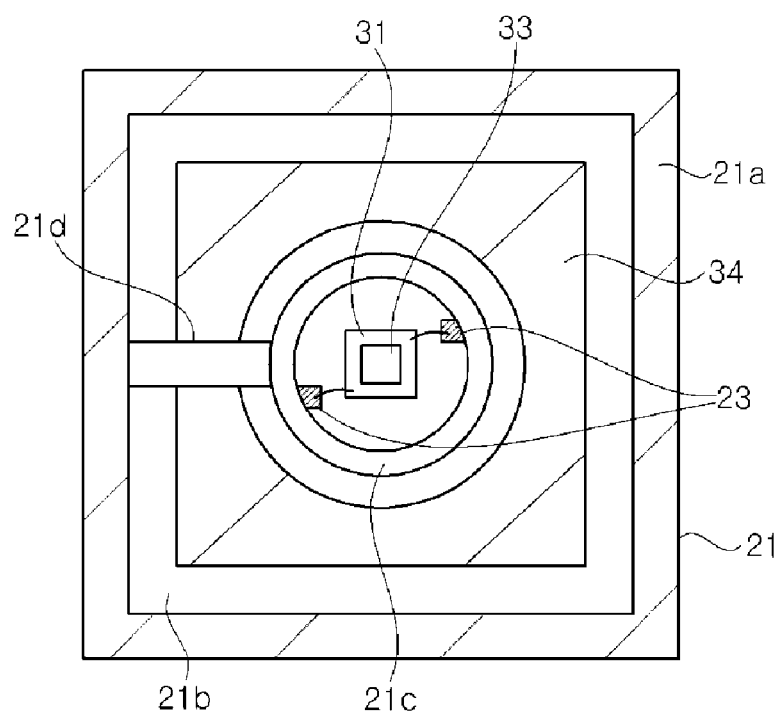
Figure 5:
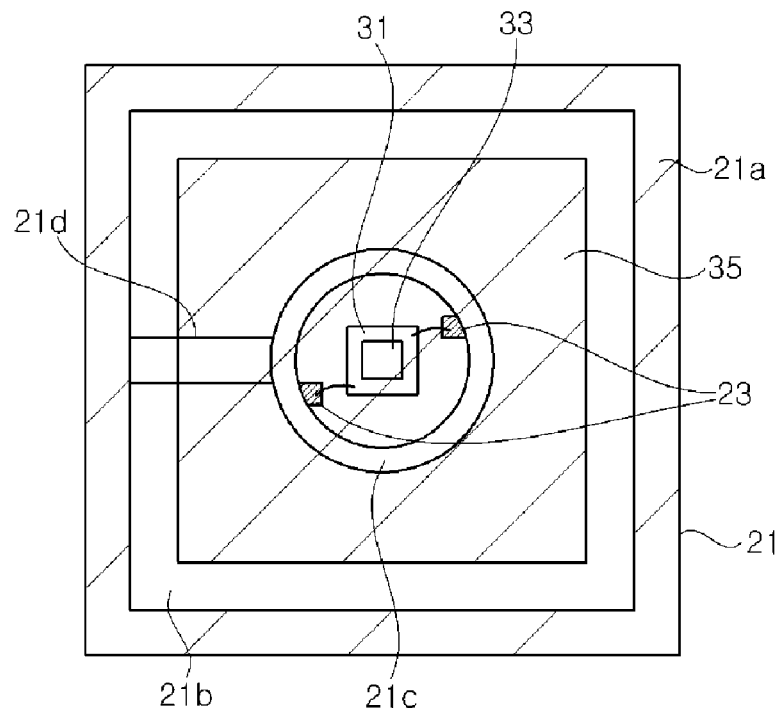

FIG. 3 to FIG. 5 are plan views illustrating a method of fabricating a light emitting diode package according to one embodiment of the present invention.

Referring to FIG. 3, first, a package body (21) including a cavity (21c) and an air discharge channel (21d) is prepared. The package body (21) may have an upper surface (21b) surrounding the cavity (21c), and an outer wall (21a) surrounding the upper surface (21b). The air discharge channel (21d) extends from the cavity (21c) towards the outer wall (21a). In addition, the package body (21) may include lead terminals (23).

The package body (21) may be formed by simultaneous burning of a ceramic sheet, but is not limited thereto. Alternatively, the package body (21) may be a plastic body having lead terminals.

Referring to FIG. 4, a light emitting diode (33) is placed within the cavity (21c) of the package body (21). The light emitting diode (33) may be mounted on a sub-mount (31) by flip-chip bonding, and the sub-mount (31) may be connected to the lead terminals (23) by bonding wires. However, it should be understood that the present invention is not limited thereto and the light emitting diode (33) may be directly coupled to the lead terminals (23) of the package body (21) by flip-chip bonding.

A bonding agent (34) may be applied to the upper surface (21b) surrounding the cavity (21c). The bonding agent (34) is applied to an area of the upper surface excluding the air discharge channel (21d).

Referring to FIG. 5, a transparent member (35) is disposed to cover an upper side of the cavity. The bonding agent (34) is placed between the transparent member (35) and the upper surface (21b) of the package body (21) to bond the transparent member (35) to the package body (21). The transparent member (35) may be placed above the cavity (21c) using, for example, a lens holder (not shown). The lens holder may be used to compress the transparent member (35) relative to the package body (21) such that internal air is discharged outside from the cavity (21c) through the air discharge channel (21d). Accordingly, even when the lens holder is removed, the transparent member (35) is not separated from the package body (21).

The bonding agent (34) may be a thermosetting resin. Thus, after the transparent member (35) is placed on the bonding agent (34), the transparent member (35) is coupled to the package body (21) by heat curing. During curing of the bonding agent (34), expanding air is also discharged outside through the air discharge channel (21d), thereby preventing separation of the transparent member (35) by air pressure. The bonding agent is not limited to the thermosetting resin and may include UV curable resins. The bonding agent (34) may also be applied to the transparent member (35) and the transparent member (35) to which the bonding agent (34) is applied may be disposed to cover the upper side of the cavity (21c).

Then, a sealing material (37) (see FIG. 1) is formed in the air discharge channel (21d) to block the air discharge channel, thereby providing a light emitting diode package as shown in FIG. 1. The sealing material (37) may be formed by injecting a curable resin into the air discharge channel (21d) exposed outside the transparent member (35), followed by curing the curable resin.

Figure 6:
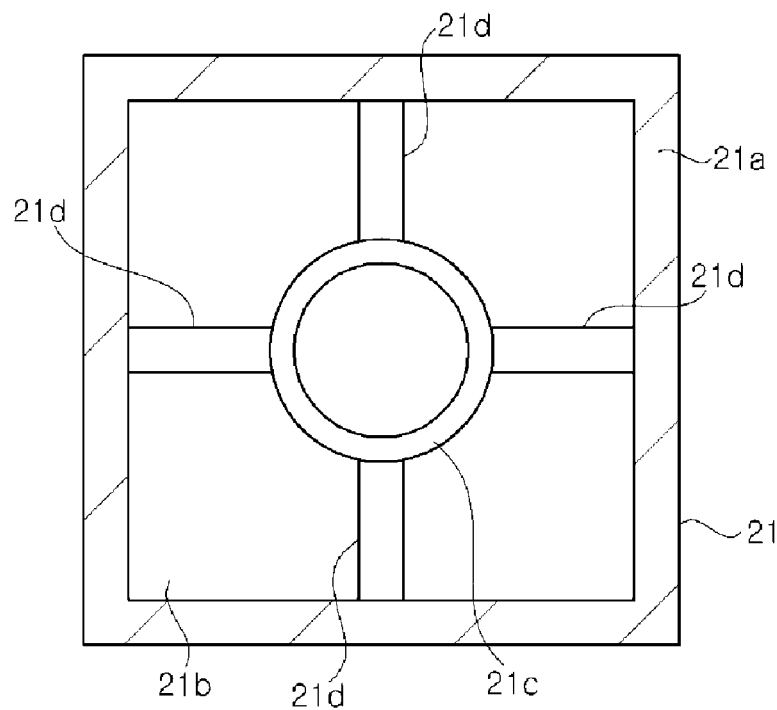
FIG. 6, FIG. 7 and FIG. 8 are plan views of light emitting diode packages according to other embodiments of the present invention.
Figure 7:
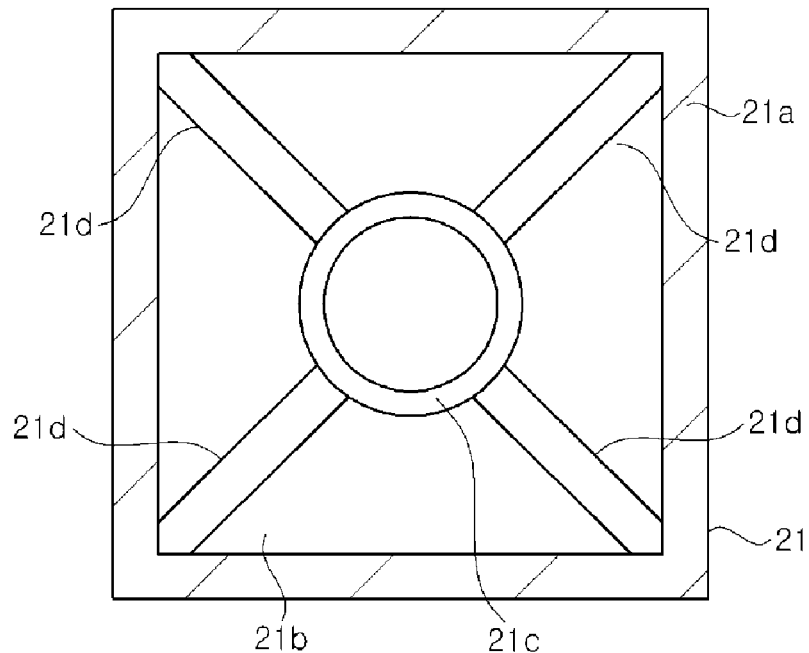
Figure 8:
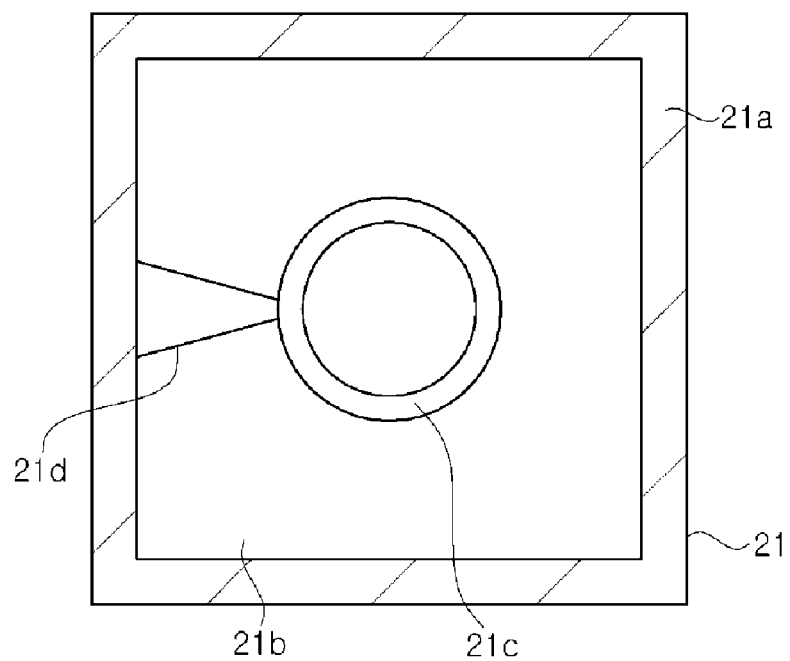

FIG. 6, FIG. 7 and FIG. 8 are plan views of light emitting diode packages according to other embodiments of the present invention.

Although the light emitting diode package includes a single air discharge channel (21d) in the embodiment of FIG. 1, the light emitting diode package may include a plurality of air discharge channels (21d), as shown in FIG. 6 or FIG. 7. These air discharge channels (21d) may be arranged in a symmetrical structure, but is not limited thereto. As in the embodiment described above, each of the air discharge channels (21d) is blocked by the sealing material (37).

On the other hand, the sealing materials (37) can flow into the cavity (21c) in the course of forming the sealing materials (37) in the air discharge channels (21d). Consequently, the air discharge channels (21d) can be insufficiently blocked by the sealing materials. To prevent this problem, the width of the air discharge channels (21d) may be changed. For example, as shown in FIG. 8, the air discharge channel (21d) placed near the outer wall (21a) may have a greater width than the air discharge channel (21d) placed near the cavity (21c). As a result, the air discharge channels (21d) can be more easily filled with the curable resin upon injection of the curable resin into the air discharge channel (21d) using a dispenser or the like.

Figure 9:
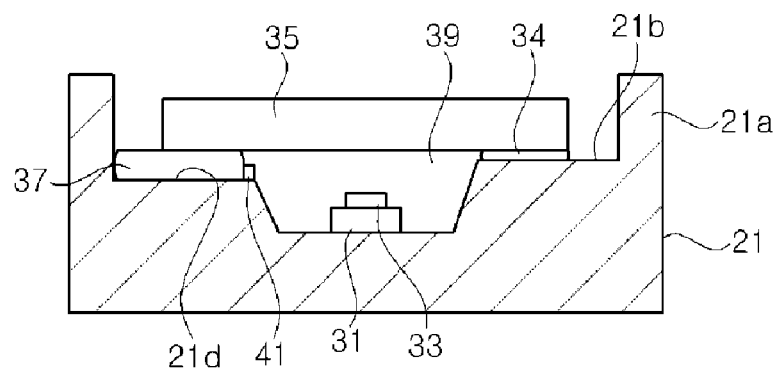
FIG. 9 is a sectional view of a light emitting diode package according to yet another embodiment of the present invention.

FIG. 9 is a sectional view of a light emitting diode package according to yet another embodiment of the present invention.

The light emitting diode package according to this embodiment is generally similar to the light emitting diode package shown in FIG. 1 and FIG. 2 except for a sealing material blocking dam (41).

The sealing material blocking dam (41) is placed between the sealing material (37) and the cavity (21c). The sealing material blocking dam (41) prevents a curing resin from flowing into the cavity (21c) upon formation of the sealing material (37) using the curable resin.

Figure 10:
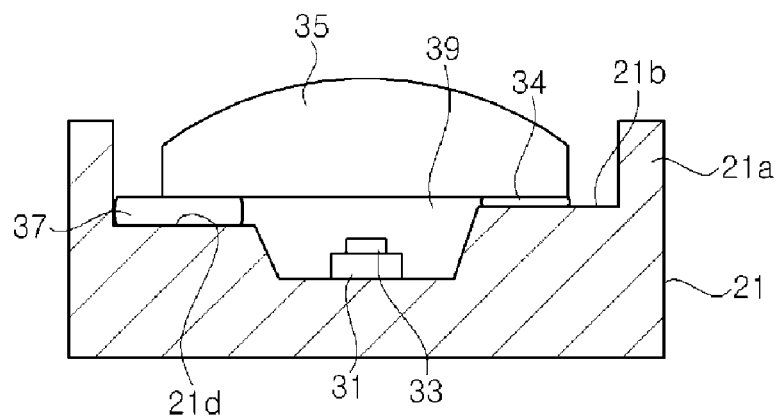
FIG. 10 is a sectional view of a light emitting diode package according to yet another embodiment of the present invention.

FIG. 10 is a sectional view of a light emitting diode package according to yet another embodiment of the present invention.

Referring to FIG. 10, the light emitting diode package according to this embodiment is similar to the light emitting diode package shown in FIG. 1 and FIG. 2 except that the transparent member (35) has a semi-spherical shape. In the above embodiments, the transparent member (35) is illustrated as having a planar sheet shape. However, as in this embodiment, the transparent member (35) may have any shape so long as the transparent member (35) allows light emitted from the light emitting diode (33) to pass therethrough. For example, the transparent member (35) may include various lenses such as a spherical lens, a Fresnel lens, and the like, as well as a semi-spherical lens.

Although some embodiments have been disclosed herein, these embodiments are given by way of illustration only and are not to be construed in any way as limiting the present invention. Thus, some features of a certain embodiment may also be applied to other embodiments without departing from the spirit and scope of the invention.

The invention claimed is:

1. A light emitting diode package, comprising:
a package body comprising a cavity and an air discharge channel connected to the cavity;
a light emitting diode disposed in the cavity;
a transparent member covering an upper side of the cavity;
a bonding agent disposed between the transparent member and the package body;
a sealing material disposed in the air discharge channel and blocking the air discharge channel; and
a sealing material blocking dam disposed on the package body between the sealing material and the cavity,
wherein the cavity comprises a closed space.

2. The light emitting diode package of claim 1, wherein the air discharge channel extends from the cavity to an outside of the transparent member.

3. The light emitting diode package of claim 2, wherein a first portion of the air discharge channel disposed outside the transparent member has a greater width than a second portion of the air discharge channel disposed near the cavity.

4. The light emitting diode package of claim 1, wherein the package body comprises a plurality of air discharge channels, each of the plurality of air discharge channels being blocked by the sealing material.

5. The light emitting diode package of claim 1, wherein the transparent member comprises a planar sheet-shaped lens, a semi-spherical lens, or a spherical lens.

6. The light emitting diode package of claim 1, wherein the bonding agent comprises a thermosetting resin or a UV curable resin.

7. The light emitting diode package of claim 1, wherein the air discharge channel comprises a groove extending from the cavity, and the bonding agent connects the transparent member to the package body in a region surrounding the cavity and excluding the air discharge channel.

8. The light emitting diode package of claim 7, wherein the sealing material fills a space between the transparent member and the groove, and blocks the air discharge channel.

9. The light emitting diode package of claim 1, wherein the light emitting diode is configured to emit UV light having a wavelength ranging from 250 nm to 365 nm.

10. The light emitting diode package of claim 1, further comprising a sub-mount substrate,
wherein the light emitting diode is flip-chip bonded to the sub-mount substrate.

11. The light emitting diode package of claim 1, wherein the package body comprises a ceramic.

* * * * *